United States Patent
Yu et al.

(10) Patent No.: US 8,993,434 B2
(45) Date of Patent: Mar. 31, 2015

(54) METHODS FOR FORMING LAYERS ON A SUBSTRATE

(75) Inventors: Jick M. Yu, San Jose, CA (US); Rong Tao, San Jose, CA (US); Xinyu Fu, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 56 days.

(21) Appl. No.: 13/226,612

(22) Filed: Sep. 7, 2011

(65) Prior Publication Data

US 2012/0070982 A1 Mar. 22, 2012

Related U.S. Application Data

(60) Provisional application No. 61/384,938, filed on Sep. 21, 2010.

(51) Int. Cl.
| | | |
|---|---|---|
| H01L 21/4763 | (2006.01) | |
| H01L 21/285 | (2006.01) | |
| H01L 21/768 | (2006.01) | |

(52) U.S. Cl.
CPC ...... *H01L 21/2855* (2013.01); *H01L 21/76843* (2013.01); *H01L 21/76865* (2013.01); *H01L 21/76868* (2013.01); *H01L 21/76873* (2013.01); *H01L 21/76879* (2013.01); *H01L 2221/1089* (2013.01)
USPC .................................. 438/628; 257/E21.584

(58) Field of Classification Search
USPC .......................................... 438/628, 629, 639
See application file for complete search history.

(56) References Cited

U.S. PATENT DOCUMENTS

| | | | |
|---|---|---|---|
| 6,169,036 B1 * | 1/2001 | Bhowmik et al. ............. | 438/710 |
| 6,228,754 B1 | 5/2001 | Iacoponi et al. | |
| 6,403,466 B1 * | 6/2002 | Lopatin ......................... | 438/627 |
| 6,565,718 B1 * | 5/2003 | Chour et al. ............. | 204/192.15 |
| 6,827,870 B1 * | 12/2004 | Gianchandani et al. ........ | 216/71 |
| 7,199,052 B2 * | 4/2007 | Cohen .......................... | 438/687 |
| 7,344,896 B2 * | 3/2008 | Leuschner et al. ................ | 438/3 |
| 7,585,760 B2 * | 9/2009 | Andryushchenko et al. . | 438/626 |
| 7,700,479 B2 * | 4/2010 | Huang et al. .................. | 438/643 |
| 2006/0009045 A1 * | 1/2006 | Tsutae .......................... | 438/783 |
| 2006/0014378 A1 | 1/2006 | Aggarwal et al. | |
| 2006/0030151 A1 * | 2/2006 | Ding et al. .................... | 438/687 |
| 2008/0190760 A1 * | 8/2008 | Tang et al. ............... | 204/192.17 |
| 2009/0215264 A1 | 8/2009 | Yu et al. | |
| 2010/0167540 A1 * | 7/2010 | Sakuma et al. .............. | 438/676 |
| 2011/0306200 A1 | 12/2011 | Lee et al. | |

OTHER PUBLICATIONS

International Search Report and Written Opinion mailed Apr. 16, 2012 for PCT Application No. PCT/US2011/050656.

* cited by examiner

*Primary Examiner* — Reema Patel
(74) *Attorney, Agent, or Firm* — Moser Taboada; Alan Taboada

(57) ABSTRACT

Methods for forming layers on a substrate having one or more features formed therein are provided herein. In some embodiments, a method for forming layers on a substrate having one or more features formed therein may include depositing a seed layer within the one or more features; and etching the seed layer to remove at least a portion of the seed layer proximate an opening of the feature such that the seed layer comprises a first thickness disposed on a lower portion of a sidewall of the feature proximate a bottom of the feature and a second thickness disposed on an upper portion of the sidewall proximate the opening of the feature and wherein the first thickness is greater than the second thickness.

19 Claims, 7 Drawing Sheets

METHODS FOR FORMING LAYERS ON A SUBSTRATE

CROSS-REFERENCE TO RELATED APPLICATIONS

This application claims benefit of U.S. provisional patent application Ser. No. 61/384,938, filed Sep. 21, 2010, which is herein incorporated by reference.

FIELD

Embodiments of the present invention generally relate to substrate processing.

BACKGROUND

Conventional integrated circuit fabrication typically requires the deposition of multiple layers of material within substrate features. For example, as illustratively shown in FIG. 4A, a seed layer 410 may be deposited atop a barrier layer 408 formed on a substrate 400 having one or more features (one shown) 412 formed therein. Conventional theory dictates that an ideal seed layer 410 has a uniform thickness along the sidewalls 414 and bottom 416 of the feature 412, for example, as shown in FIG. 4A. In practice, however, the inventors have observed that conventional seed layer deposition processes do not produce such an ideal geometry and instead typically produce a seed layer 410 having a greater thickness on the sidewalls 414 proximate the opening 411 of the feature 412 as compared to the thickness on the sidewalls 414 proximate the bottom 416 of the feature 412, as depicted in FIG. 4B. Unfortunately, by producing a seed layer 410 having such a geometry, a buildup of seed layer 410 material may occur on the corners 418 of the feature 412, resulting in of the opening 411 of the feature 412 being partially or fully closed, preventing material from filling the feature 412 during subsequent processing.

Accordingly, the inventors have provided improved methods for forming layers on substrates having one or more features formed therein.

SUMMARY

Methods for forming layers on a substrate having one or more features formed therein are provided herein. In some embodiments, a method for forming layers on a substrate having one or more features formed therein may include depositing a seed layer within the one or more features; and etching the seed layer to remove at least a portion of the seed layer proximate an opening of the feature such that the seed layer comprises a first thickness disposed on a lower portion of a sidewall of the feature proximate a bottom of the feature and a second thickness disposed on an upper portion of the sidewall proximate the opening of the feature and wherein the first thickness is greater than the second thickness.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
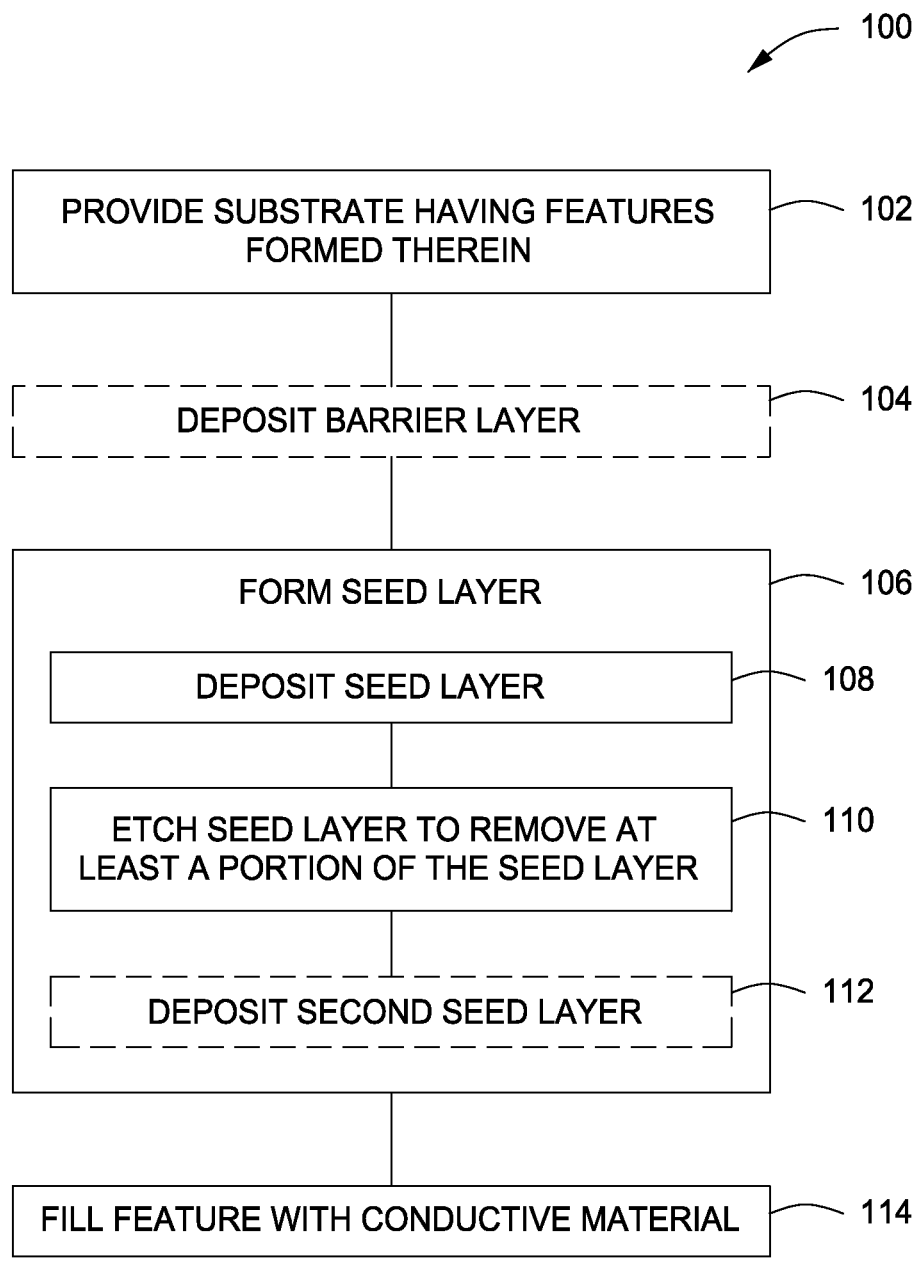
FIG. 1 is a flow diagram of a method for forming layers on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming layers on a substrate having one or more features formed therein are provided herein. Embodiments of the inventive methods may advantageously provide a seed layer having a greater thickness disposed on a lower portion of a sidewall of the feature proximate a bottom of the feature as compared to a thickness proximate the opening of the feature, thereby reducing a buildup of material on the upper corners of the feature, thus preventing the feature from being closed prior to subsequent deposition of addition layers and/or materials. In addition, by providing a seed layer in the manner discussed above, the inventive methods may further advantageously allow for subsequently deposited materials to fill the feature from the bottom of the feature to the top, thereby allowing the feature to be filled completely and without undesirable void formation.

FIG. 1 depicts a method 100 for processing of substrates in accordance with some embodiments of the present invention. FIGS. 2A-F are illustrative cross-sectional views of a substrate during different stages of the method depicted in FIG. 1, in accordance with some embodiments of the present invention. The method 100 may be performed in any apparatus suitable for processing substrates in accordance with embodiments of the present invention, for example such as the process chamber 300 discussed below with respect to FIG. 3.

Figure 2A:
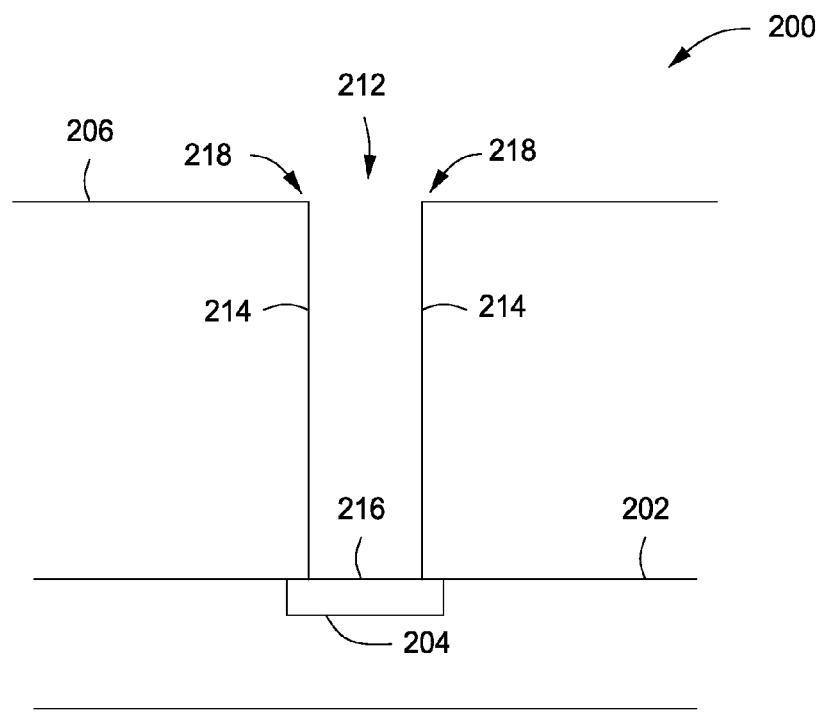
FIGS. 2A-F depict illustrative cross-sectional views of a substrate during different stages of processing in accordance with some embodiments of the present invention.
Figure 2B:
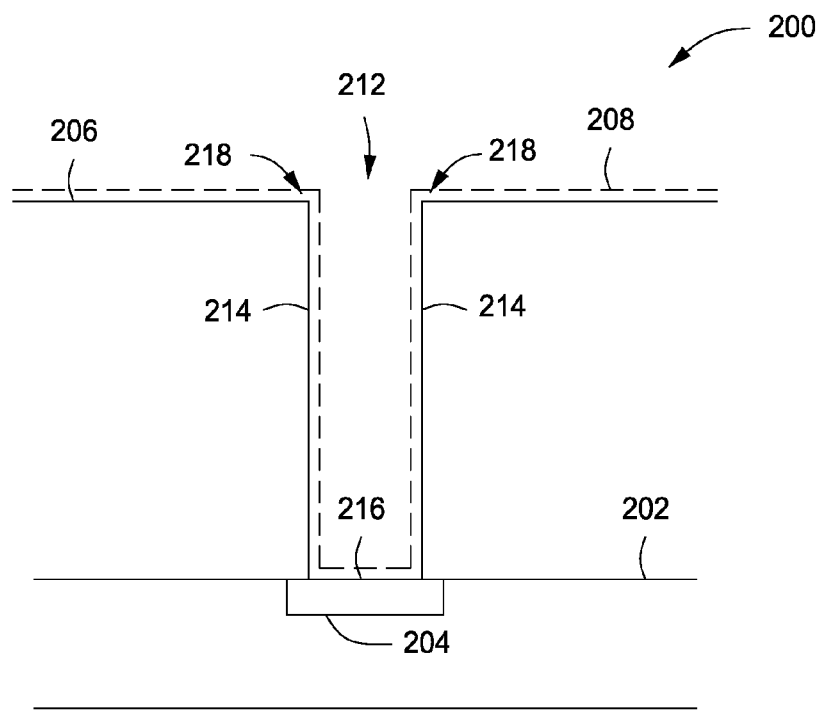

The method 100 begins at 102, where a substrate 200 having a feature, such as opening 212, formed therein is provided, as depicted in FIG. 2A. The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the substrate 200 may comprise one or more layers, for example, such as a bulk dielectric layer 206 formed over a dielectric layer 202, as depicted in FIG.

2A. A conductive feature 204 may be formed in an upper region of the dielectric layer 202 such that an upper surface of the conductive feature 204 may be exposed by the opening 212 formed in the bulk dielectric layer 206. For example, a via/trench etching process may be performed to define the opening 212 in the bulk dielectric layer 206, thereby exposing an upper surface of the conductive feature 204. The conductive feature 204 may be fabricated from any suitable conductive material. For example, for a copper interconnect, the conductive feature 204 may be a copper layer embedded in the dielectric layer 202. In some embodiments, the conductive feature 204 may be fabricated from a metal, such as copper, aluminum, tungsten, or the like, alloys thereof, or combinations thereof.

The bulk dielectric layer 206 and the dielectric layer 202 may be fabricated from the same or different dielectric materials. In some embodiments, the dielectric materials may comprise silicon oxide ($SiO_2$), silicon nitride (SiN), a low-K material, or the like. The low-k material may be carbon-doped dielectric materials (such as carbon-doped silicon oxide (SiOC), BLACK DIAMOND® dielectric material available from Applied Materials, Inc. of Santa Clara, Calif., or the like), an organic polymer (such as polyimide, parylene, or the like), organic doped silicon glass (OSG), fluorine doped silicon glass (FSG), or the like. As used herein, low-k materials are materials having a dielectric constant less than about that of silicon oxide, which is about 3.9.

The opening 212 is generally defined by one or more sidewalls 214, a bottom surface 216 and upper corners (bevel) 218. The opening 212 may be any feature suitable for substrate fabrication, for example such as a via, a trench, a dual damascene feature, or the like, and may be formed through any suitable process such as an etch process. Although only one opening 212 is shown, multiple features may be simultaneously processed in accordance with the teachings disclosed herein. The opening 212 may generally have any dimensions. For example, in some embodiments, the opening 212 may have a ratio of a height of the feature to a width of the feature of at least about 2:1. In some embodiments, the opening 212 may be a high aspect ratio feature. In such embodiments, the opening 212 may have a ratio of a height of the feature to a width of the feature of at least about 4:1. In some embodiments, the opening 212 may have a width of about 5 to about 50 nm.

Although the substrate 200 is depicted as having a bulk dielectric layer 206 formed over a dielectric layer 202, the substrate 200 may also include different and/or additional material layers. In addition, other features, such as trenches, vias, or the like, may be formed in different and/or additional material layers.

Next, at 104, a barrier layer 208 may be optionally deposited atop the substrate 200. When present, the barrier layer 208 may serve as an electrical and/or physical barrier between the substrate and layers to be subsequently deposited in the opening, and/or may function as a better surface for attachment during the deposition process discussed below than a native surface of the substrate. The barrier layer 208 may comprise any materials suitable to perform the above discussed functions. For example, in some embodiments, the barrier layer 208 may comprise one of titanium (Ti), tantalum (Ta), oxides or nitrides thereof, or the like. The barrier layer 208 may be deposited to any suitable thickness, for example, about 0.5 to about 10 nm.

The barrier layer 208 may be deposited by any suitable method, for example, such as chemical vapor deposition (CVD), physical vapor deposition (PVD), or the like. For example, in some embodiments, the barrier layer 208 may be deposited via a PVD process in a suitable process chamber, such as the process chamber 300 described below with respect to FIG. 3. In such embodiments, the process chamber may have a target (e.g. target 342) disposed therein that comprises a source material to be deposited atop the substrate 200. For example, in embodiments where the barrier layer comprises tantalum nitride ($TaN_x$), the target may comprise tantalum (Ta).

In some embodiments, depositing the barrier layer 208 may include providing a process gas to the process chamber to react with source material from the target. The reaction causes the target to eject atoms of the target material, which are then directed towards the substrate 200. In some embodiments, the process gas may comprise an inert gas, such as argon (Ar), helium (He), krypton (Kr), neon (Ne), xenon (Xe), or the like. The deposition gas may be provided at a flow rate of between about 2 to about 200 sccm. In some embodiments, a plasma may be formed from the process gas to facilitate sputtering the source material from the target. In such embodiments, about 5 to about 40 kW of DC power may be applied to the target to ignite the process gas and maintain a plasma.

In some embodiments, to facilitate directing the ejected atoms from the target towards the substrate 200 a bias power in the form of RF power may be applied to a substrate support pedestal (e.g., substrate support pedestal 252 discussed above) supporting the substrate 200. In such embodiments about 50 to about 2000 W of RF power may be supplied at a frequency of between 2 to about 60 MHz, or about 13.56 MHz.

In addition to the above, additional process parameters may be utilized to facilitate depositing the barrier layer 208. For example, in some embodiments, the process chamber may be maintained at a pressure of about 0.2 to about 50 mTorr. In addition, in some embodiments, the process chamber may be maintained at a temperature of about 20 to about 200 degrees Celsius.

Figure 2C:
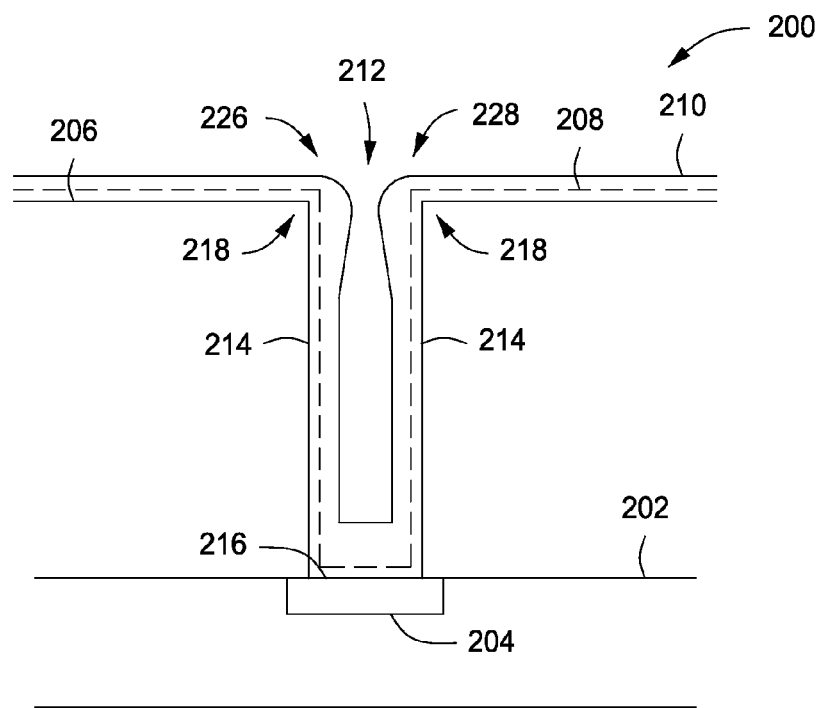

Next, at 106, a seed layer 210 is deposited within the opening 212, as depicted in FIG. 2C. The seed layer 210 provides a better surface for attachment and may act as a template for subsequently deposited materials, for example, such as the conductive materials discussed below. The seed layer 210 may comprise any materials suitable to provide the aforementioned functions. For example, in some embodiments, the seed layer may comprise one of copper (Cu), ruthenium (Ru), cobalt (Co), or the like, and alloys thereof, such as copper-aluminum (Cu—Al), copper-manganese (Cu—Mn), copper-magnesium (Cu—Mg), or the like.

To form the seed layer 210, first at 108, the seed layer 210 is deposited within the opening 212 (and atop the substrate 200), as depicted in FIG. 2C. The seed layer 210 may be deposited via any deposition process suitable to form the seed layer having a desired profile, for example, such as PVD, CVD, or the like. For example, in some embodiments, the seed layer 210 may be deposited via a PVD process in a suitable process chamber, such as the process chamber 300 described below with respect to FIG. 3. In such embodiments, the process chamber may have a target (e.g. target 342) disposed therein that comprises a source material to be deposited atop the substrate 200. For example, in embodiments where the seed layer 210 comprises copper (Cu), the target may comprise a copper (Cu) source material.

In some embodiments, depositing the seed layer 210 may include providing a process gas to the process chamber to physically sputter source material from the target, e.g., to cause the target to eject atoms of the target material, which are then directed towards the substrate 200. In some embodiments, the process gas may comprise an inert gas, such as argon (Ar), helium (He), krypton (Kr), neon (Ne), xenon (Xe), or the like. The process gas may be provided at a flow rate of between about 4 to about 300 sccm, or in some embodiments, about 4 sccm. In some embodiments, a plasma may be formed from the process gas to facilitate sputtering the source material from the target. In such embodiments, about 5 to about 40 kW of DC power, or in some embodiments, about 30 kW of DC power may be applied to the target to ignite the process gas and maintain the plasma.

In some embodiments, to facilitate directing the ejected atoms from the target towards the substrate 200 a bias power in the form of RF power may be applied to a substrate support pedestal (e.g., substrate support pedestal 352) supporting the substrate 200. In such embodiments, about 50 to about 2000 W of RF power, or in some embodiments about 120 W of RF power may be supplied at a frequency of between 2 to about 60 MHz, or about 13.56 MHz.

In addition to the above, additional process parameters may be utilized to facilitate depositing the seed layer 210. For example, in some embodiments, the process chamber may be maintained at a pressure of about 0.1 to about 50 mTorr. In addition, in some embodiments, the process chamber may be maintained at a temperature of about 20 to about 200 degrees Celsius.

Figure 2D:
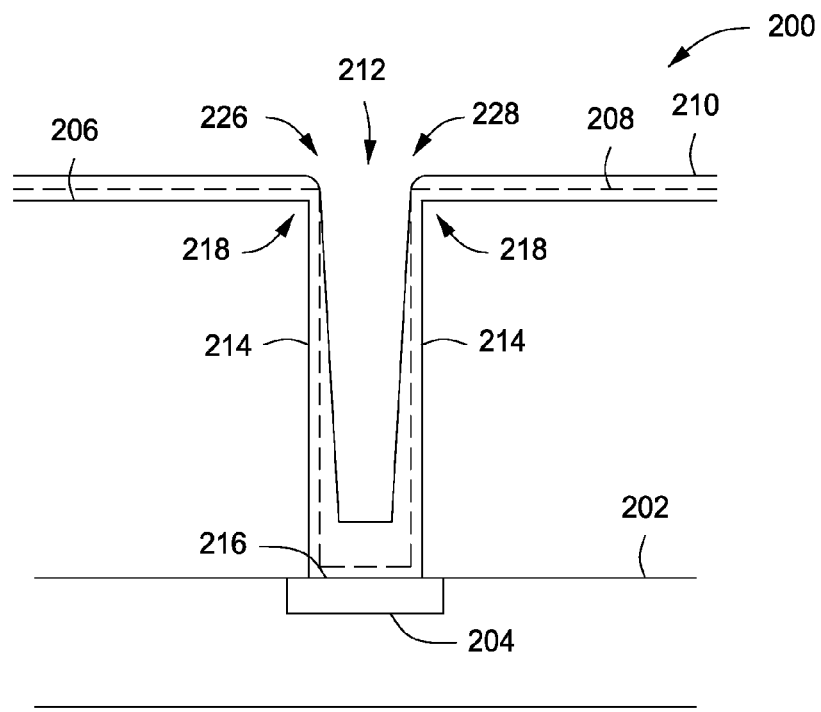

In some embodiments, the inventors have observed that when depositing the seed layer 210 via a PVD process as described above, the seed layer material may accumulate near the upper corners 218 of the opening 212. In conventional processing, the accumulation of seed layer material may partially or fully close off the opening 212 and create a void. Accordingly, next at 110, the seed layer 210 is etched to remove at least a portion of the seed layer 210 proximate the upper corners 218 of the opening 212, as depicted in FIG. 2D (e.g., to provide an etched seed layer). By etching at least a portion of the seed layer 210, the thickness of the seed layer 210 may be controlled at desired locations along the sidewalls 214 and proximate the upper corners 218 of the opening 212 to provide an inwardly sloped seed layer profile (e.g., the average seed layer thickness increases from an upper portion 226, 228 of the opening 212 towards the bottom 216 of the opening 212), such as depicted in FIG. 2D. For example, in some embodiments, a thickness of the seed layer 210 formed on the sidewalls 214 proximate the bottom 216 of the opening 212 may be about 2 to about 10 nm and a thickness of the seed layer 210 formed on the sidewalls 214 proximate the upper portion of the opening 212 may be about 1 to about 5 nm. In some embodiments, the seed layer 210 may not be a continuous layer. For example, in some embodiments, no seed layer 210 material may be disposed on portions of the sidewalls 214 proximate the upper portion 226, 228 of the opening 212 or the upper corners 218 of the opening 212. The thickness of the seed layer may change dependent upon feature size. In some embodiments, the seed layer thickness at the lower portion of the sidewall may be more than twice of the seed layer thickness at the upper portion of the sidewall.

The seed layer 210 etch may be performed in the same process chamber, or in some embodiments a different process chamber, than the process chamber utilized in the deposition of the seed layer 210 described above. In some embodiments, etching the seed layer 210 may include forming a plasma from a process gas and bombarding the substrate 200 with charged ions from the plasma. The etch of the seed layer 210 may be done either separately, as described above, or during a second step of deposition by increasing the RF power applied to the substrate support. For example, the process described below is a simultaneous deposition and etch process. The magnitude of the RF bias power supplied to the substrate may be used to control the etching of the material deposited on the substrate.

The process gas may comprise any gas suitable to form the plasma to etch the seed layer 210, for example such as an inert gas, such as argon (Ar), helium (He), krypton (Kr), neon (Ne), xenon (Xe), or the like. The process gas may be provided at a flow rate of between about 10 to about 300 sccm, or in some embodiments, about 100 sccm. The process gas may be formed into a plasma by coupling a source power to the process gas within the process chamber under suitable conditions to establish and maintain the plasma. For example, in some embodiments, about 5 to about 40 kW of DC power, or in some embodiments, about 20 kW of DC power may be provided to ignite the process gas and maintain the plasma. In some embodiments, a bias power may be applied to the substrate to facilitate directing ions from the plasma towards the substrate, thereby facilitating the etching process. For example, in some embodiments, the bias power may be about 50 to about 2000 W, or in some embodiments about 600 W at a frequency of about 2 to about 60 MHz, or about 13.56 MHz.

In addition to the above, additional process parameters may be utilized to facilitate etching the seed layer 210. For example, in some embodiments, the process chamber may be maintained at a pressure of about 1 to about 50 mTorr. In addition, in some embodiments, the process chamber may be maintained at a temperature of about 20 to about 200 degrees Celsius.

Figure 5A:
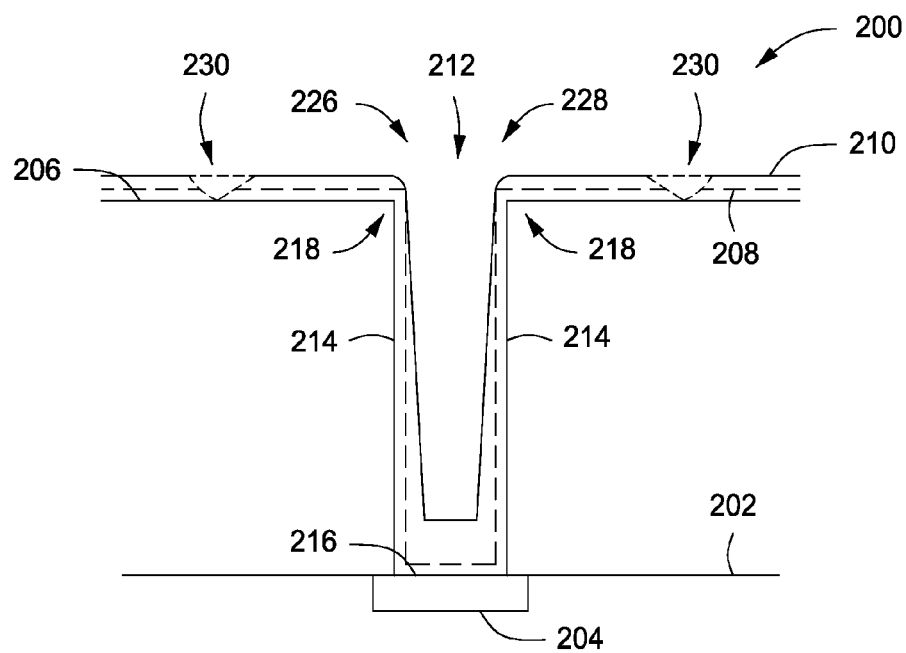
FIGS. 5A-B depict illustrative cross-sectional views of a substrate during different stages of processing in accordance with some embodiments of the present invention.
Figure 5B:
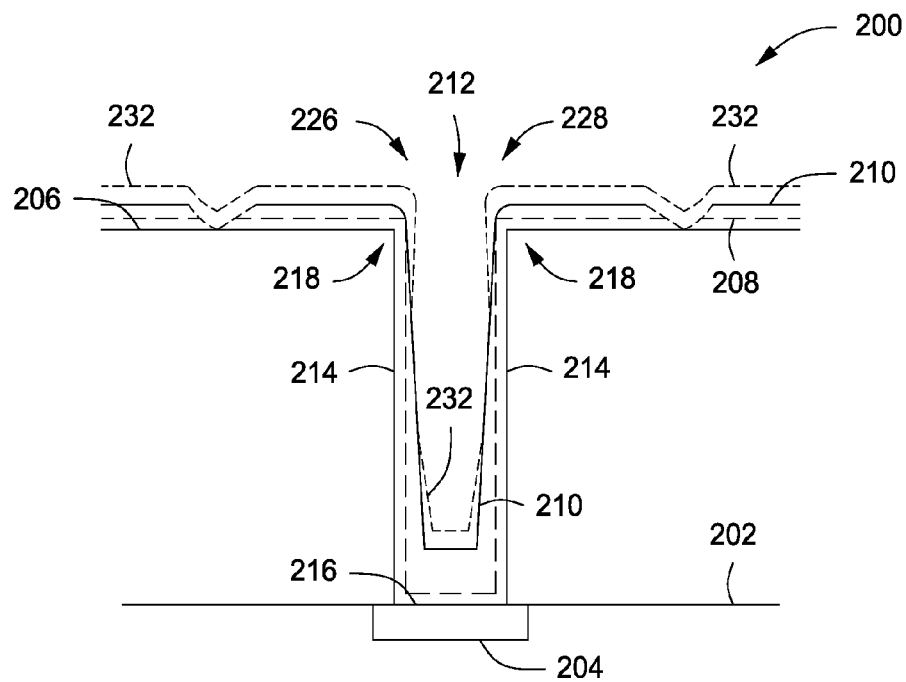

In some embodiments, etching the seed layer 210 may remove all or substantially all of the material in portions of the seed layer 210 (e.g., portions 230 shown in FIG. 5A). Accordingly, and optionally, at 112, after etching the seed layer 210, a second seed layer 232 may be deposited over the substrate (e.g., atop the etched seed layer 210), as shown in FIG. 5B. The second seed layer 232 may comprise the same, or in some embodiments, a different material as the seed layer 210. For example, in embodiments where the seed layer 210 comprises a copper alloy, the second seed layer 232 may comprise copper (Cu).

In some embodiments, the second seed layer 232 may be deposited to a thickness of less than or equal to about one half of the thickness of the material deposited for the seed layer 210 at 108. Thus, depositing the second seed layer 232 may facilitate at least partially replenishing the material removed from the seed layer 210 to facilitate complete coverage of the seed layer 210 over the substrate 200. The more complete coverage of the seed layer 210 may facilitate more complete deposition of material during subsequent processing, as discussed below. Upon completion of the optional deposition of the second seed layer 232, the method 100 may continue as depicted in FIG. 1, at 114, and FIG. 2E (if the optional deposition of the second seed layer 232 is not performed, the method 100 may proceed directly as discussed with respect to FIG. 1, at 114, and FIG. 2E).

Figure 2E:
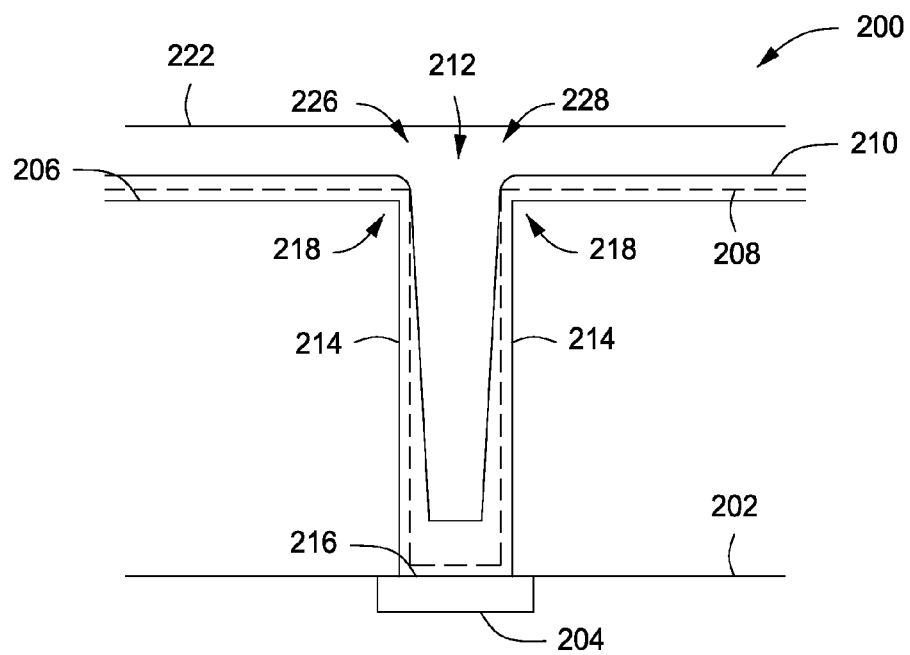

Next, at 114, a conductive material 222 may be deposited atop the seed layer 210 to fill the opening 212, as depicted in FIG. 2E. In embodiments where the seed layer 210 does not form a continuous layer (described above), portions of the conductive material 222 may be deposited directly atop the barrier layer 208. The conductive material 222 may be deposited in any manner such as electrochemical deposition, or plating (ECP), or the like. The conductive material 222 may be any suitable conductive material, such as aluminum (Al), copper (Cu), or the like.

In some embodiments, the inventors have observed that a growth rate of the conductive material 222 during deposition may increase as the thickness of the seed layer 210 increases.

For example, in some embodiments, the growth rate of the conductive material 222 may be higher when deposited atop portions of the seed layer 210 having a greater thickness (e.g. the portions of the seed layer 210 disposed on the sidewalls proximate the bottom 216 of the opening 212 and the portions of the seed layer deposited on the bottom itself) as compared to the growth rate of the conductive material 222 when deposited atop portions of the seed layer 210 having a lower thickness (e.g. the portions of the seed layer 210 disposed on the sidewalls proximate the top of the opening 212 and the portions of the seed layer deposited on the upper corners 218). Accordingly, by providing the seed layer 210 having a sloped profile (as discussed above) the growth rate of the conductive material 222 may be greater proximate the bottom 216 of the opening 212, thereby allowing the opening 212 to be filled from the bottom 216 to the top. Filling the feature from the bottom 216 to the top may prevent an excess amount of conductive material 222 to form near the upper corners 218 of the feature, thereby preventing the opening 212 from being closed before fully filling the opening 212 with the conductive material 222.

Figure 2F:
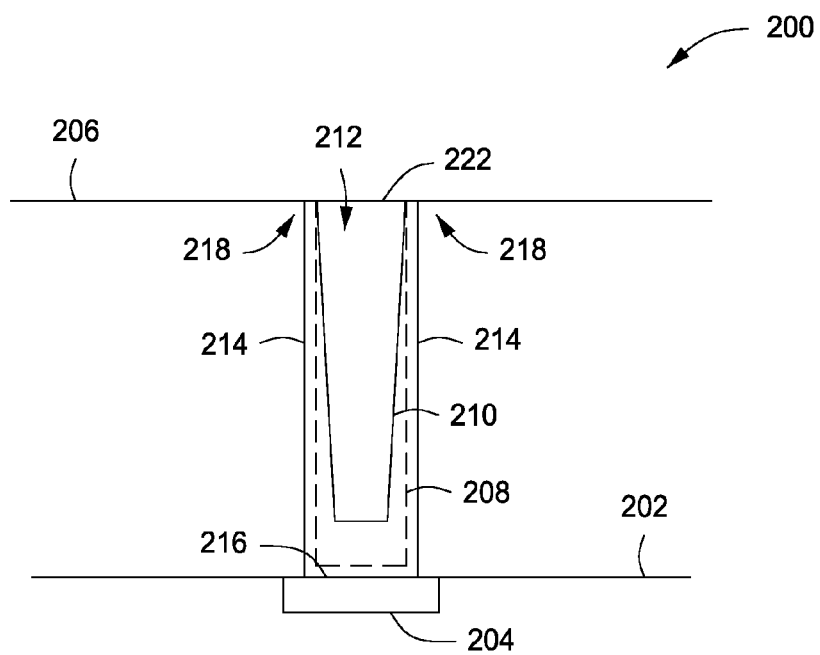

After filling the opening 212 with the conductive material 222, chemical mechanical polishing (CMP) or other suitable technique may be used to remove the excess conductive material 222 outside the opening 212 (and any other features, such as other vias, trenches, dual damascene structures, or the like), as depicted in FIG. 2F.

After depositing the conductive material 222 to fill the opening 212, the method generally ends and the substrate 200 may proceed for further processing, such as deposition, etch, annealing, or the like. For example, in some embodiments additional layers may be deposited, for example additional dielectric layers and/or metallization structures may be formed over the filled opening 212.

Figure 4A:
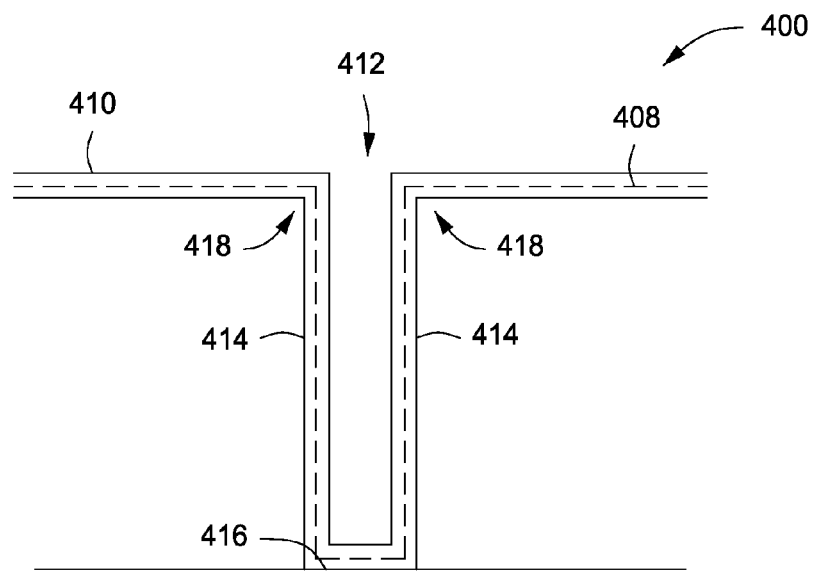
FIGS. 4A-B depict illustrative cross-sectional views of a substrate having a seed layer deposited within a feature formed in the substrate respectively in accordance with a theoretical ideal and conventional processing.
Figure 4B:
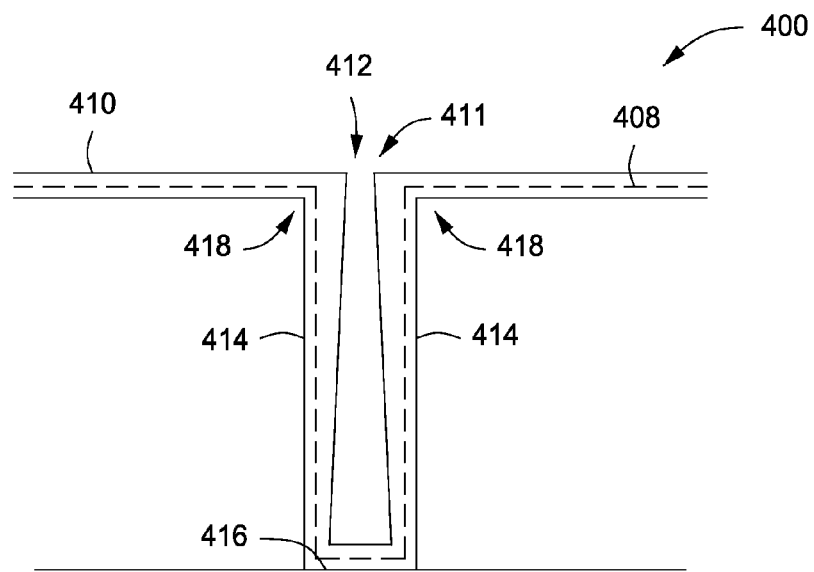

The inventive methods described herein may be performed in a process chamber as described below. FIG. 4 illustrates a process chamber suitable for processing substrates in accordance with some embodiments of the present invention. Examples of suitable process chambers include the ENDURA® EXTENSA TTN and ENDURA® ENCORE processing chambers, both commercially available from Applied Materials, Inc., of Santa Clara, Calif. It is contemplated that other processing chambers, including those from other manufacturers, may also be utilized to perform the present invention.

In some embodiments, the processing chamber 300 contains a substrate support pedestal 352 for receiving the substrate 200 thereon, and a sputtering source, such as a target 342. The substrate support pedestal 352 may be located within a grounded enclosure wall 350, which may be a chamber wall (as shown) or a grounded shield (not shown). The substrate support pedestal 352 may include any suitable means (not shown) of providing heat to the substrate 200, for example, such as a resistive heating element, radiant cavity and light source, or the like.

The target 342 may be supported on a grounded conductive aluminum adapter 344 through a dielectric isolator 346. The target 342 comprises a material to be deposited on the substrate 200 during sputtering, such as titanium when depositing a titanium nitride film in accordance with embodiments of the present invention.

The substrate support pedestal 352 has a material-receiving surface facing the principal surface of the target 342 and supports the substrate 200 to be sputter coated in planar position opposite to the principal surface of the target 342. The substrate support pedestal 352 may support the substrate 200 in a central region 340 of the processing chamber 300. The central region 340 is defined as the region above the substrate support pedestal 352 during processing (for example, between the target 342 and the substrate support pedestal 352 when in a processing position).

Figure 3:
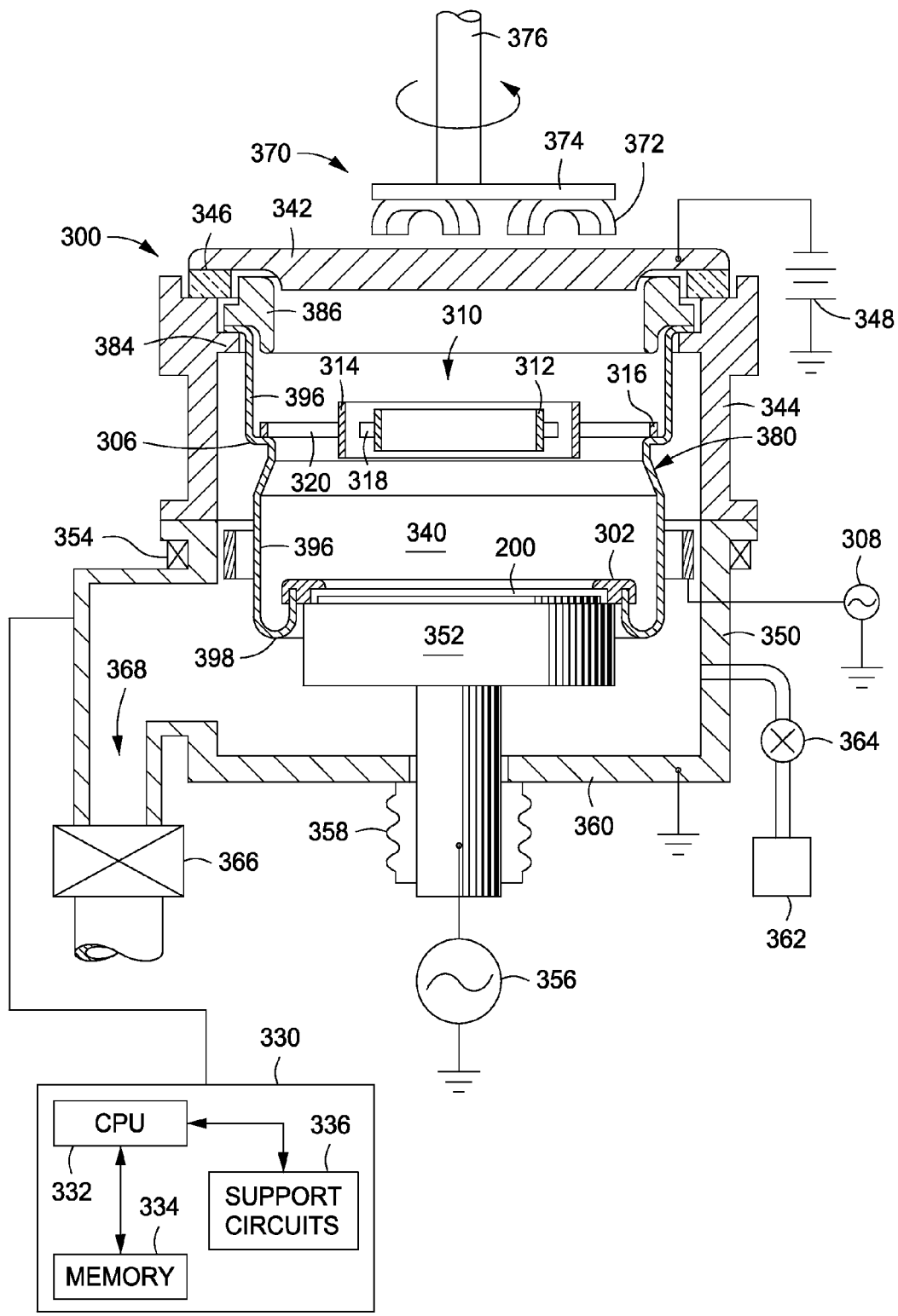
FIG. 3 depicts a process chamber suitable for processing substrates in accordance with some embodiments of the present invention.

The substrate support pedestal 352 is vertically movable through a bellows 358 connected to a bottom chamber wall 360 to allow the substrate 200 to be transferred onto the substrate support pedestal 352 through a load lock valve (not shown) in the lower portion of processing the chamber 300 and thereafter raised to a deposition, or processing position as depicted in FIG. 3. One or more processing gases may be supplied from a gas source 362 through a mass flow controller 364 into the lower part of the chamber 300. An exhaust port 368 may be provided and coupled to a pump (not shown) via a valve 366 for exhausting the interior of the processing chamber 300 and facilitating maintaining a desired pressure inside the processing chamber 300.

A controllable DC power source 348 may be coupled to the chamber 300 to apply a negative voltage, or bias, to the target 342. An RF power supply 356 may be coupled to the substrate support pedestal 352 in order to induce a negative DC bias on the substrate 200. In addition, in some embodiments, a negative DC self-bias may form on the substrate 200 during processing. In other applications, the substrate support pedestal 352 may be grounded or left electrically floating.

A rotatable magnetron 370 may be positioned proximate a back surface of the target 342. The magnetron 370 includes a plurality of magnets 372 supported by a base plate 374. The base plate 374 connects to a rotation shaft 376 coincident with the central axis of the chamber 300 and the substrate 200. The magnets 372 produce a magnetic field within the chamber 300, generally parallel and close to the surface of the target 342 to trap electrons and increase the local plasma density, which in turn increases the sputtering rate. The magnets 372 produce an electromagnetic field around the top of the chamber 300, and magnets 372 are rotated to rotate the electromagnetic field which influences the plasma density of the process to more uniformly sputter the target 342.

The chamber 300 further includes a grounded bottom shield 380 connected to a ledge 384 of the adapter 344. A dark space shield 386 is supported on the bottom shield 380 and is fastened to the shield 380 by screws or other suitable manner. The metallic threaded connection between the bottom shield 380 and the dark space shield 386 allows the two shields 380, 386 to be grounded to the adapter 344. The adapter 344 in turn is sealed and grounded to the aluminum chamber sidewall 350. Both shields 380, 386 are typically formed from hard, non-magnetic stainless steel.

The bottom shield 380 extends downwardly in an upper tubular portion 394 of a first diameter and a lower tubular portion 396 of a second diameter. The bottom shield 380 extends along the walls of the adapter 344 and the chamber wall 350 downwardly to below a top surface of the substrate support pedestal 352 and returns upwardly until reaching a top surface of the substrate support pedestal 352 (e.g., forming a u-shaped portion 398 at the bottom). A cover ring 302 rests on the top of the upwardly extending inner portion of the bottom shield 380 when the substrate support pedestal 352 is in its lower, loading position but rests on the outer periphery of the substrate support pedestal 352 when it is in its upper, deposition position to protect the substrate support pedestal 352 from sputter deposition. An additional deposition ring (not shown) may be used to shield the periphery of the substrate 200 from deposition.

An RF coil 304 may be disposed just outside the periphery of the substrate 200 in a lower half or third of the space between the target 342 and the substrate support pedestal 352.

Multiple insulating supports (not shown) in the bottom shield 380 support the RF coil 304 and also supply RF power and grounding to the RF coil 304. The coil 304 may be a single-turn, nearly tubular coil composed of copper and having a small gap between the closely spaced electrical leads for power and grounding. An RF power supply 308 may be provided to supply RF power to the RF coil 304 to generate an argon plasma in a region removed from the target 342. Generally, the target 342 may be DC powered for sputter deposition and the RF coil 304 may be utilized for sputter etching of the substrate 200. However, in some embodiments, an RF supply may power the target sputtering process.

The chamber 300 may also be adapted to provide a more directional sputtering of material onto a substrate. In some embodiments, directional sputtering may be achieved by positioning an optional collimator 310 between the target 342 and the substrate support pedestal 352 to provide a more uniform and symmetrical flux of deposition material to the substrate 200.

The collimator 310, when present, may rest on the ledge portion of the bottom shield 380, thereby grounding the collimator 310. The collimator 310 may be a metal ring and may include an outer tubular section and at least one inner concentric tubular section, for example, three concentric tubular sections 312, 314, 316 linked by cross struts 320, 318. The outer tubular section 316 rests on the ledge portion 306 of the bottom shield 380. The use of the bottom shield 380 to support the collimator 310 simplifies the design and maintenance of the chamber 300. At least the two inner tubular sections 312, 314 are of sufficient height to define high aspect ratio apertures that partially collimate the sputtered particles. Further, the upper surface of the collimator 310 acts as a ground plane in opposition to the biased target 342, which facilitates keeping plasma electrons away from the substrate 200.

In some embodiments, a magnet 354 may be disposed about the chamber 300 for selectively providing a magnetic field between the substrate support pedestal 352 and the target 342. For example, as shown in FIG. 3, the magnet 354 may be disposed about the outside of the chamber wall 350 in a region just above the substrate support pedestal 352 when in processing position. The magnet 354 may be an electromagnet and may be coupled to a power source (not shown) for controlling the magnitude of the magnetic field generated by the electromagnet.

A controller 330 is coupled to various components of the process chamber 300 for controlling the operation thereof and comprises a central processing unit (CPU) 332, a memory 334, and support circuits 336 for the CPU 332. The controller 330 may control the substrate processing apparatus directly, or via computers (or controllers) associated with particular process chamber and/or the support system components. The controller 330 may be one of any form of general-purpose computer processor that can be used in an industrial setting for controlling various chambers and sub-processors. The memory, or computer-readable medium, 334 of the CPU 332 may be one or more of readily available memory such as random access memory (RAM), read only memory (ROM), floppy disk, hard disk, flash, or any other form of digital storage, local or remote. The support circuits 336 are coupled to the CPU 332 for supporting the processor in a conventional manner. These circuits include cache, power supplies, clock circuits, input/output circuitry and subsystems, and the like. Inventive methods as described herein may be stored in the memory 334 as software routine that may be executed or invoked to control the operation of the process chamber 300 in the manner described herein, for example, such as described above with respect to the method 100. The software routine may also be stored and/or executed by a second CPU (not shown) that is remotely located from the hardware being controlled by the CPU 332.

Thus, methods for forming layers on a substrate having one or more features formed therein are provided herein. Embodiments of the inventive methods may advantageously provide a seed layer having a greater thickness disposed on a lower portion of a sidewall of the feature proximate a bottom of the feature as compared to a thickness proximate the opening of the feature, thereby reducing a buildup of material on the upper corners of the feature, thus preventing the feature from being closed prior to filling it with material. In addition, by providing a seed layer in the manner discussed above, the inventive methods may further advantageously allow for subsequently deposited materials to fill the feature from the bottom of the feature to the top, thereby allowing the feature to be filled completely and without void formation.

While the foregoing is directed to embodiments of the present invention, other and further embodiments of the invention may be devised without departing from the basic scope thereof.

The invention claimed is:

1. A method for forming layers on a substrate having one or more features, comprising:
   depositing a seed layer within the one or more features; and
   plasma etching the seed layer, prior to depositing any additional layers, to remove all of the seed layer proximate an opening of the feature such that the seed layer comprises a first thickness disposed on a lower portion of a sidewall of the feature proximate a bottom of the feature and no seed layer disposed on upper corners of the opening and an upper portion of the sidewall proximate the opening of the feature.

2. The method of claim 1, wherein the seed layer comprises one of copper (Cu), ruthenium (Ru), cobalt (Co), copper alloys, ruthenium alloys or cobalt alloys.

3. The method of claim 1, wherein the first thickness is about 2 to about 10 nm.

4. The method of claim 1, wherein at least substantially all of the seed layer is removed from an upper bevel of the one or more features.

5. The method of claim 1, wherein the seed layer is deposited via a physical deposition (PVD) process comprising:
   sputtering a source material from a target in the presence of a plasma formed from a process gas comprising one of argon (Ar), helium (He), krypton (Kr), neon (Ne) or xenon (Xe).

6. The method of claim 5, wherein forming the plasma comprises applying about 5 to about 40 kW of DC power to the target to ignite the process gas.

7. The method of claim 6, further comprising:
   providing up to about 2 kW of a substrate bias RF power at a frequency of about 2 to about 60 MHz to deposit a layer comprising the source material atop a barrier layer disposed within the feature.

8. The method of claim 1, wherein etching the seed layer comprises:
   providing a process gas comprising one of argon (Ar), helium (He), krypton (Kr), neon (Ne) or xenon (Xe); and
   forming a plasma from the process gas to etch the seed layer.

9. The method of claim 8, wherein forming the plasma comprises applying about 5 to about 40 kW of DC power to a target to ignite the process gas.

10. The method of claim 9, further comprising:
providing at least 50 W of a substrate bias RF power at a frequency of about 2 to about 60 MHz to etch the seed layer.

11. The method of claim 1, wherein the one or more features comprise a ratio of height to width of greater than 2:1.

12. The method of claim 1, wherein the seed layer does not form a continuous layer on the sidewalls of the feature.

13. The method of claim 1, further comprising:
depositing a barrier layer atop the substrate prior to depositing the seed layer.

14. The method of 13, wherein the barrier layer comprises one of titanium (Ti), tantalum (Ta), titanium nitride (TiN) or tantalum nitride (TaN).

15. The method of claim 1, further comprising:
depositing a conductive material atop the seed layer to fill the feature.

16. The method of claim 1, further comprising:
depositing a second seed layer atop the etched seed layer.

17. A method for forming layers on a substrate having one or more features, comprising:
depositing a seed layer within the one or more features; and
etching the seed layer to remove all of the seed layer proximate an opening of the feature such that the seed layer comprises a first thickness disposed on a lower portion of a sidewall of the feature proximate a bottom of the feature and no seed layer disposed on upper corners of the opening and an upper portion of the sidewall proximate the opening of the feature, wherein etching the seed layer further comprises simultaneously depositing seed layer material while etching the seed layer, and wherein depositing the seed layer and etching the seed layer are performed in the same process chamber.

18. A non-transitory computer readable medium having instructions stored thereon that, when executed, cause a method for forming layers on a substrate having one or more features to be performed in a process chamber, the method comprising:
depositing a seed layer within the one or more features; and
plasma etching the seed layer, prior to depositing any additional layers, to remove all of the seed layer proximate an opening of the feature such that the seed layer comprises a first thickness disposed on a lower portion of a sidewall of the feature proximate a bottom of the feature and no seed layer disposed on upper corners of the opening and an upper portion of the sidewall proximate the opening of the feature.

19. The non-transitory computer readable medium of claim 18, wherein the method further comprises:
depositing a barrier layer atop the substrate prior to depositing the seed layer.

\* \* \* \* \*